(12) United States Patent
Hsiao et al.

(10) Patent No.: US 10,580,558 B2
(45) Date of Patent: Mar. 3, 2020

(54) TEXTURE INDUCING STRUCTURE FOR ALLOY FILMS AND TEXTURE INDUCING METHOD THEREOF

(71) Applicant: NATIONAL TSING HUA UNIVERSITY, Hsinchu (TW)

(72) Inventors: Chi-Ju Hsiao, Taichung (TW); Heng-Sheng Hsiao, Hsinchu (TW); Jen-Yuan Chang, Hsinchu (TW); Tsung-Shune Chin, Taichung (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 255 days.

(21) Appl. No.: 15/641,238

(22) Filed: Jul. 4, 2017

(65) Prior Publication Data

US 2018/0358159 A1 Dec. 13, 2018

(30) Foreign Application Priority Data

Jun. 7, 2017 (TW) .............................. 106118896 A

(51) Int. Cl.
| | |
|---|---|
| *H01F 10/12* | (2006.01) |
| *H01F 41/14* | (2006.01) |
| *B32B 15/01* | (2006.01) |
| *C01B 25/08* | (2006.01) |
| *B32B 15/04* | (2006.01) |
| *H01F 10/30* | (2006.01) |
| *C22C 19/07* | (2006.01) |
| *B81B 3/00* | (2006.01) |

(52) U.S. Cl.
CPC ........... *H01F 10/123* (2013.01); *B32B 15/01* (2013.01); *B32B 15/043* (2013.01); *C01B 25/08* (2013.01); *C01B 25/088* (2013.01); *C22C 19/07* (2013.01); *H01F 10/30* (2013.01); *H01F 41/14* (2013.01); *B81B 3/0091* (2013.01)

(58) Field of Classification Search
None
See application file for complete search history.

(56) References Cited

U.S. PATENT DOCUMENTS

| | | | | |
|---|---|---|---|---|
| 5,242,728 A | * | 9/1993 | Mizukami .............. | G11B 5/656 428/668 |
| 2008/0031035 A1 | * | 2/2008 | Rodmacq ............ | H01F 10/3236 365/171 |
| 2008/0151615 A1 | * | 6/2008 | Rodmacq ............... | B82Y 25/00 365/173 |

OTHER PUBLICATIONS

Chi-Ju Hsiao et al., "Enhancement in (002) texture of electroplated Co-based hard magnet layers", AIP Advance, published in May 2017, vol. 7, issue 5, pp. 1-6, published by AIP Publishing, United States.

* cited by examiner

*Primary Examiner* — Kevin M Bernatz
(74) *Attorney, Agent, or Firm* — CKC & Partners Co., LLC

(57) ABSTRACT

A texture inducing structure for alloy films is provided. The texture inducing structure includes a substrate, a texture-inducing layer and a deposition layer. The texture-inducing layer is formed on the substrate. The texture-inducing layer has an intrinsically strong crystalline texture, a texture coefficient of the texture-inducing layer is greater than 2, and a thickness of the texture-inducing layer is ranged from 0.1 µm to 6 µm. The deposition layer is formed on the texture-inducing layer. A texture of the deposition layer is induced by the texture-inducing layer thereby changing the magnetic anisotropy and the magnetic strength of the deposition layer, a thickness of the deposition layer is ranged from 1 µm~60 µm, and the thickness of the deposition layer is greater than that of the texture-inducing layer.

10 Claims, 15 Drawing Sheets

TEXTURE INDUCING STRUCTURE FOR ALLOY FILMS AND TEXTURE INDUCING METHOD THEREOF

RELATED APPLICATIONS

This application claims priority to Taiwan Application Serial Number 106118896, filed Jun. 7, 2017, which is herein incorporated by reference.

BACKGROUND

Technical Field

The present disclosure relates to a texture inducing structure and the texture inducing method thereof for alloy films. More particularly, in the texture inducing structure of the present disclosure, a texture of a thicker deposition layer is induced and enhanced by a thinner texture-inducing layer formed therebeneath, thereby enhancing the magnetic anisotropy and the magnetic strength of the deposition layer.

Description of Related Art

In the modern industries, large magnetic fields are required to the operation or the detection of many precision instruments and equipment, such as sensors, actuators, etc. Furthermore, such instruments and equipment are developed toward ever compact volume and portable size. Therefore, in the application of micro-scaled devices, many efforts are focused on integrating both compact volume and stronger magnetic field. Many hard magnetic alloys such as CoP, CoNiP, CoMnP and CoNiMnP have been widely used, where CoNiMnP is a permanent magnetic alloy that shows high perpendicular magnetic anisotropy even its thickness reaches to 20 μm to 40 μm. With advances in technology, the industry has stricter demands on the materials. Therefore, hard magnetic alloys are developed continuously. It is getting harder to search new alloys having better magnetic properties.

Therefore, there is a need to develop a method to manifestly enhancing magnetic properties of the same material based on structure design keeping low manufacturing cost and compact size.

SUMMARY

According to one aspect of the present disclosure, a texture inducing structure for alloy films is provided. The texture inducing structure includes a substrate, a texture-inducing layer and a deposition layer on top of the said texture-inducing layer. The texture-inducing layer is formed on the substrate, wherein the texture-inducing layer has an intrinsically strong crystalline texture. More specifically the texture coefficient (to be defined in paragraph 0033) of the texture-inducing layer is greater than 2, and the thickness of the texture-inducing layer ranges from 0.1 μm to 6 μm. The deposition layer is formed on the texture-inducing layer, wherein the texture of the deposition layer is induced by the texture-inducing layer thereby changing the magnetic anisotropy and the magnetic strength of the deposition layer. The thickness of the deposition layer is ranged 1~60 μm, and is greater than the texture-inducing layer.

According to another aspect of the present disclosure, a texture inducing method for alloy films is provided. The texture inducing method includes: providing a substrate; depositing a texture-inducing layer on the substrate, wherein the texture-inducing layer has an intrinsically strong crystalline texture, whose texture coefficient is greater than 2, and thickness of the texture-inducing layer ranges from 0.1 μm to 6 μm; depositing a deposition layer on the texture-inducing layer, wherein the thickness of the deposition layer is greater than that of the texture-inducing layer, and the thickness of the deposition layer ranges from 1 μm to 60 μm.

BRIEF DESCRIPTION OF THE DRAWINGS

The present disclosure can be more fully understood by reading the following detailed description of the embodiment, with reference made to the accompanying drawings as follows.

DETAILED DESCRIPTION

It is an object of the present disclosure to provide a texture inducing structure and the method thereof. A composite structure is formed on a substrate, where the composite is a combination of a thinner texture-inducing layer with an intrinsically strong texture and a thicker deposition layer deposited on the thinner texture-inducing layer. The composite structure can be repeatedly stacked to form a multi-layered composite structure. The magnetic properties of the deposition layer can be induced and enhanced by the texture-inducing layer.

Various embodiments are disclosed in the following paragraphs to describe the technical features of the present disclosure.

Figure 1:
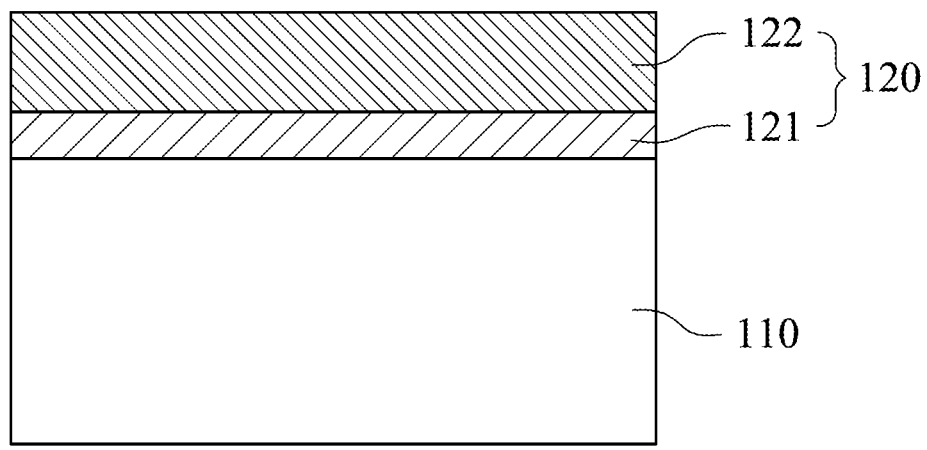
FIG. 1 is a schematic diagram showing a texture inducing structure according to one embodiment of the present disclosure.
Figure 2:
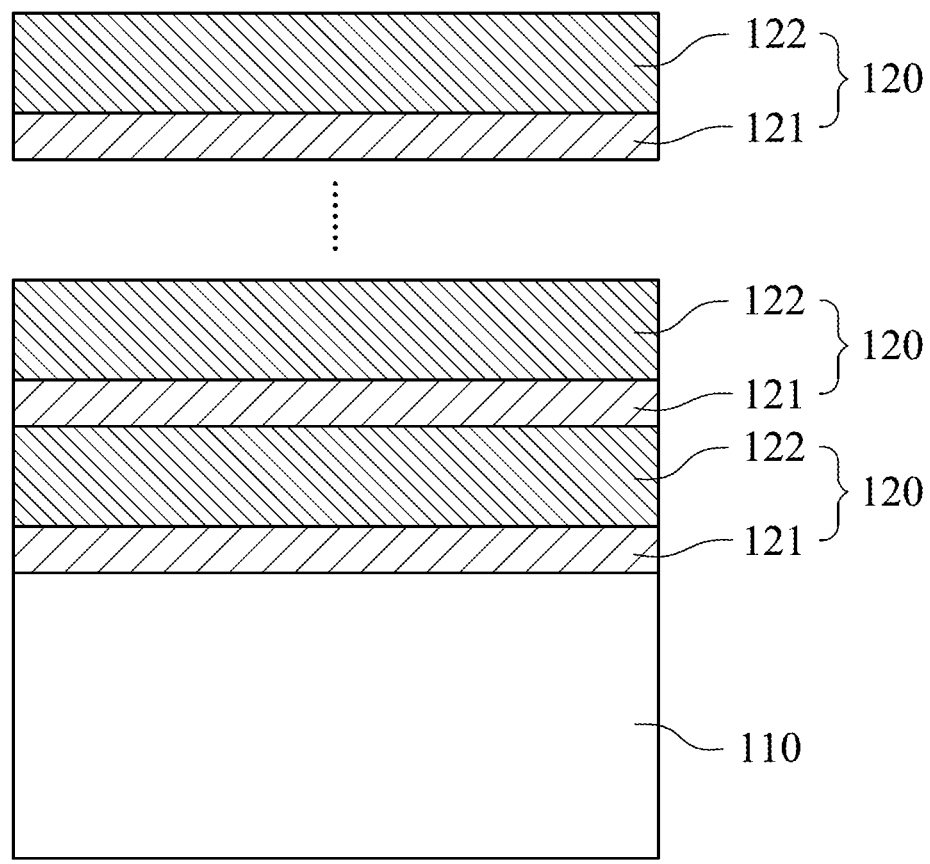
FIG. 2 is a schematic diagram showing a texture inducing structure according to another embodiment of the present disclosure.

FIG. 1 is a schematic diagram showing a texture inducing structure according to one embodiment of the present disclosure; FIG. 2 is a schematic diagram showing a texture inducing structure according to another embodiment of the present disclosure.

In FIG. 1, a thinner alloy film with a specified texture is deposited on a substrate 110, referred as a texture-inducing layer 121 in the present disclosure. The deposition of the texture-inducing layer 121 can be performed by a known film-deposition method such as vacuum deposition, electroplating, etc. And then, a thicker alloy film is deposited on the texture-inducing layer 121, referred as a deposition layer 122 in the present disclosure. The purpose is to induce the texture of the deposition 122 by the texture-inducing layer 121 to change the material properties of the deposition layer 122, such as magnetic properties, electrical properties, and mechanical properties. Furthermore, in FIG. 2, a single layer of the texture-inducing layer 121 and a single layer of the deposition layer 122 can be stacked to form a composite structure 120. The composite structure 120 can be repeatedly stacked to form a multilayered composite structure 120. In one embodiment, the texture-inducing layer 121 is an alloy film with an intrinsically strong texture along a specified crystalline direction (e.g. crystalline plane (002)) of an alloy film. In the present disclosure, the texture coefficient of the texture-inducing layer 121 is greater than 2, preferably greater than 2.5. The texture coefficient can be represented by T.C. Moreover, along a specified crystalline direction, for example, the crystalline direction [002] is referred as being perpendicular to a crystalline plane (002), whose texture coefficient can be represented as T.C.$_{(002)}$, which can be calculated by the following equation (1):

$$T.C._{(002)} = \frac{I_{(002)}/I_{0(002)}}{\frac{1}{n}\sum [I_{(hkl)}/I_{0(hkl)}]}. \quad (1)$$

In the equation (1), $I_{(002)}$ and $I_{(hkl)}$ are the intensities of the peaks of X-ray diffraction patterns of $HCP_{(002)}$ and $HCP_{(hkl)}$ taken on the deposited alloy film, respectively; $I_{0(002)}$ and $I_{0(hkl)}$ are the intensities of the peaks of standard X-ray diffraction patterns from JCPDS card of $HCP_{(002)}$ and $HCP_{(hkl)}$ of the alloy, respectively. In the following embodiments, it is shown that in the composite structure 120, the texture of the deposition layer 121 can be enhanced by the texture-inducing layer 121, thereby changing the magnetic anisotropy of the deposition layer 122. In the present disclosure, the thickness of the texture-inducing layer 121 is ranged from 0.1~6 µm, preferably 0.5~4 µm; the thickness of the deposition layer 122 is ranged from 1~60 µm, preferably 6~25 µm, and the thickness of the deposition layer 122 is greater than that of the texture-inducing layer 121. The texture-inducing layer 121 and the deposition layer 122 can be formed by the conventional vacuum deposition processes (vapor evaporation, sputtering, etc.) or electroplating process. In the following embodiments, the electroplating process is exemplified to produce the sample structure of the present disclosure, but this is not a limit. The electroplating process is performed at room temperature, electroplating parameters such as electroplating solutions, pH value, etc. are shown in the TABLE 1. The chemical compositions of the texture inducing structure 100 for alloy films, CoP, CoNiP, CoMnP and CoNiMnP are 6~7 wt % P; 12~15 wt % Ni (in case of CoNiP and CoNiMnP), and 5~8 wt % Mn (in case of CoMnP and CoNiMnP), and balanced Co.

The compositions of the electroplating solutions for forming various texture inducing structures 100 are shown in TABLE 1, the concentration is represented as M (mole/L).

TABLE 1

|  | CoP | CoNiP | CoNiMnP | CoMnP |
|---|---|---|---|---|
| CoCl$_2$ | 0.2 | 0.2 | 0.1 | 0.42 |
| CoSO$_4$ | 0.025 |  |  | 0.053 |
| CuSO$_4$ |  |  |  |  |
| MnCl$_2$ |  |  |  | 0.4 |
| NiCl$_2$ |  | 0.2 | 0.1 |  |
| MnSO$_4$ |  |  | 0.02 |  |
| NaH$_2$PO$_2$ | 1.2 | 0.3 | 0.042 | 0.2 |
| NH$_4$Cl | 0.9 |  |  |  |
| H$_3$BO$_3$ |  | 0.4 | 0.4 |  |
| NaCl |  | 0.7 | 0.4 |  |
| pH | 4.5 ± 0.1 | 4.1 ± 0.1 | 4.1 ± 0.1 | 3.7 ± 0.1 |

The following embodiments show that the electroplating process can be suitably applied in the conductive substrate and different texture-inducing layers 121 (CoP, CoNiMnP alloys) have dramatic influences on the material properties of different deposition layer 122 deposited thereon. The magnetic properties of different deposition layer 122 have 50~300% increments corresponding to different texture-inducing layers 121. In the embodiment 1 (FIGS. 3 to 9), it is shown that the magnetic anisotropy and the magnetic properties of the deposition layer 122 are enhanced when the thinner texture-inducing layer 121 are added. In the present disclosure, the magnetic properties are demonstrated by B (remanence)-H (coercivity) diagrams.

In the embodiment 2 (FIGS. 10 to 14), analyses are performed on the specified texture-inducing layer 121 (CoNiMnP alloy), and it is shown that even to the deposition layer 122 (CoMnP alloy) having a high coercivity, the texture-inducing layer 121 can further enhance its magnetic energy product (BH)$_{max}$ up to 40~50%.

In the embodiment 3, analyses are performed to different texture-inducing layers 121 with different deposition layers 122, and similar results as the aforementioned embodiments can be obtained.

In the present disclosure, an XRD (X-ray Diffraction) analysis is used to analyze the textures of the materials, and a VSM (Vibrating Sample Magnetometer) analysis is used to analyze the magnetic properties of the materials.

The details of the embodiments are described in the following paragraphs. Since in all of the following embodiments, the sample structure is similar to those in FIG. 1 and FIG. 2, and the results are shown in the data analyses, the numbering of the substrate 110, the texture-inducing layer 121 and the deposition layer 122 will be omitted for ease of representation.

Figure 3:
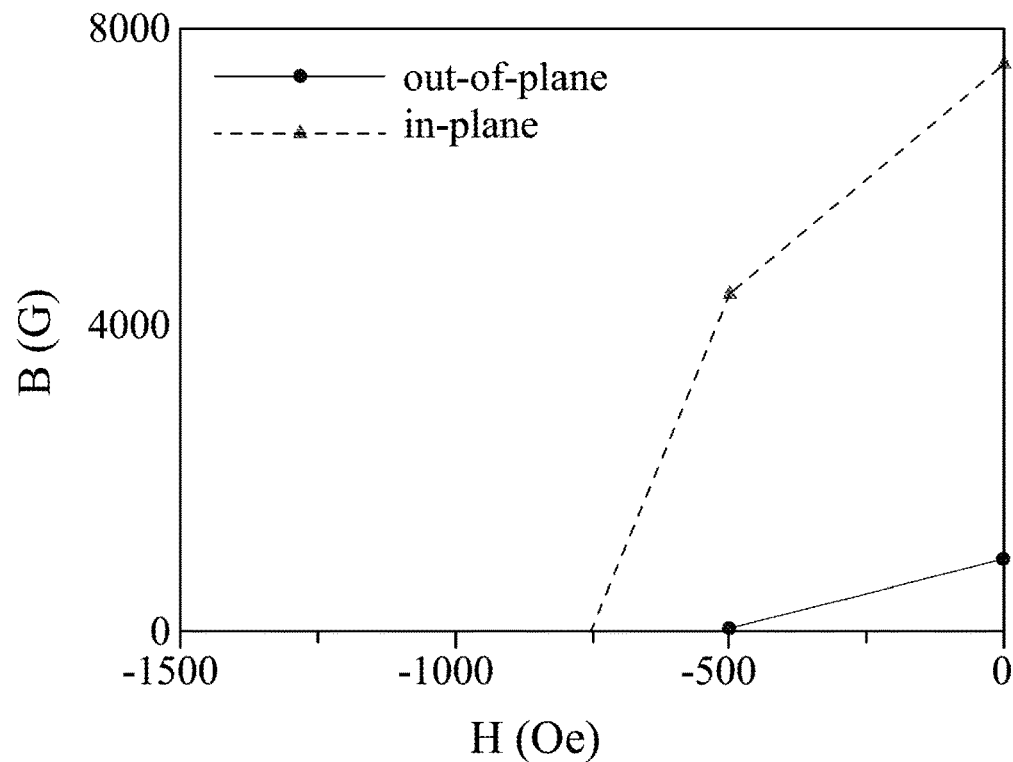
FIG. 3 is a B-H diagram of a 26 μm thickness deposition layer (CoNiP alloy) without a texture-inducing layer.
Figure 4:
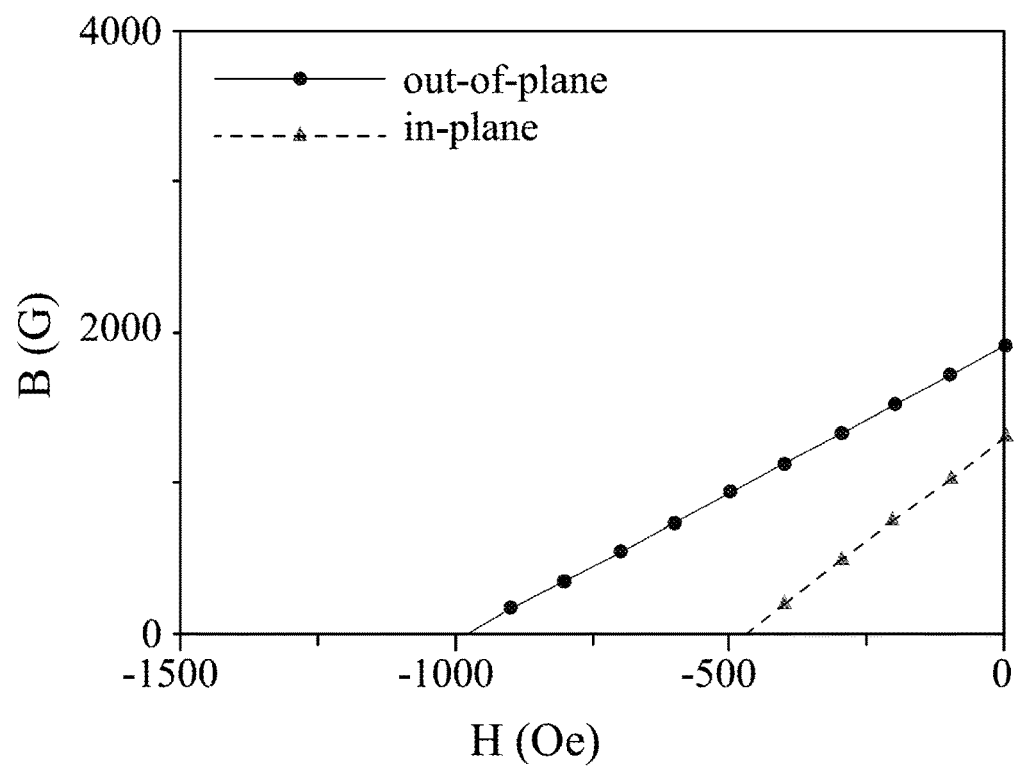
FIG. 4 is a B-H diagram of a 6 μm thickness deposition layer deposited (CoNiP alloy) on a 1 μm thickness texture-inducing layer (CoP alloy)
Figure 5:
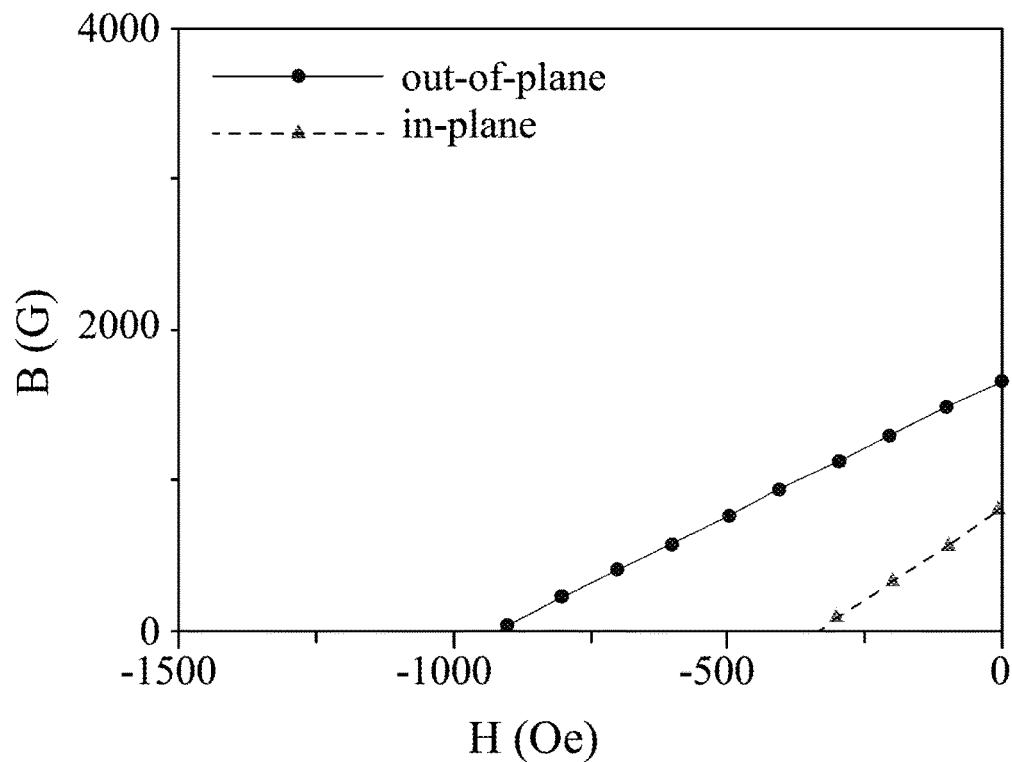
FIG. 5 is a B-H diagram of a 15 μm thickness deposition layer deposited (CoNiP alloy) on a 1 μm thickness texture-inducing layer (CoP alloy)
Figure 6:
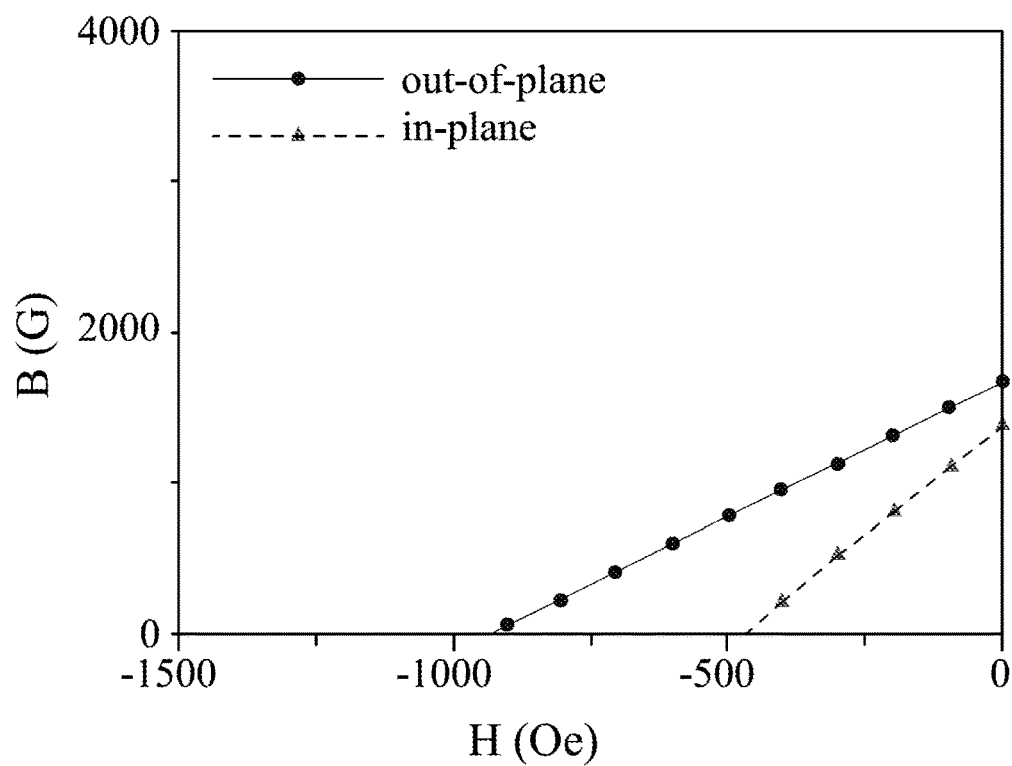
FIG. 6 is a B-H diagram of a 18 μm thickness deposition layer deposited (CoNiP alloy) on a 1 μm thickness texture-inducing layer (CoP alloy)
Figure 7:
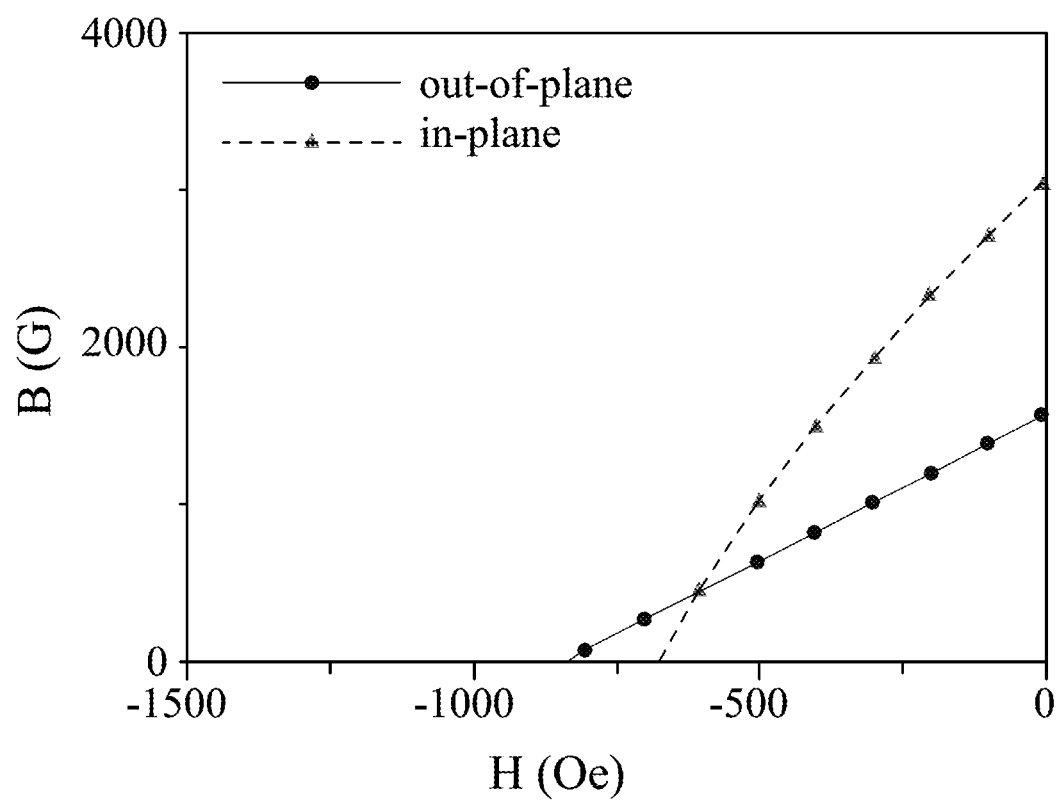
FIG. 7 is a B-H diagram of a 24 μm thickness deposition layer deposited (CoNiP alloy) on a 1 μm thickness texture-inducing layer (CoP alloy)
Figure 8:
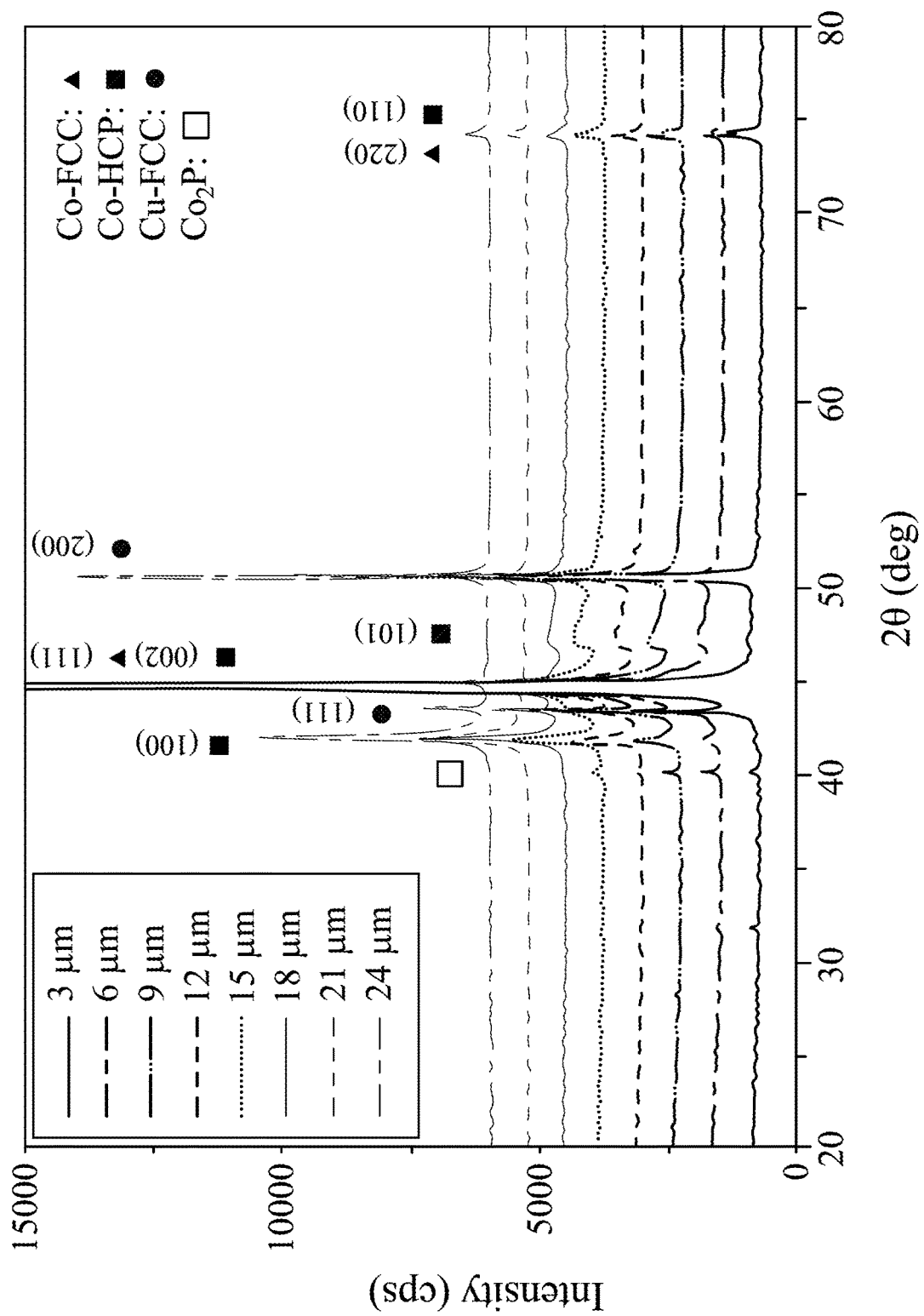
FIG. 8 is a comparison diagram of X-ray diffraction patterns of 3~24 μm thickness deposition layers (CoNiP alloy) deposited on a 1 μm thickness texture-inducing layer (CoP alloy) on a copper substrate.
Figure 9:
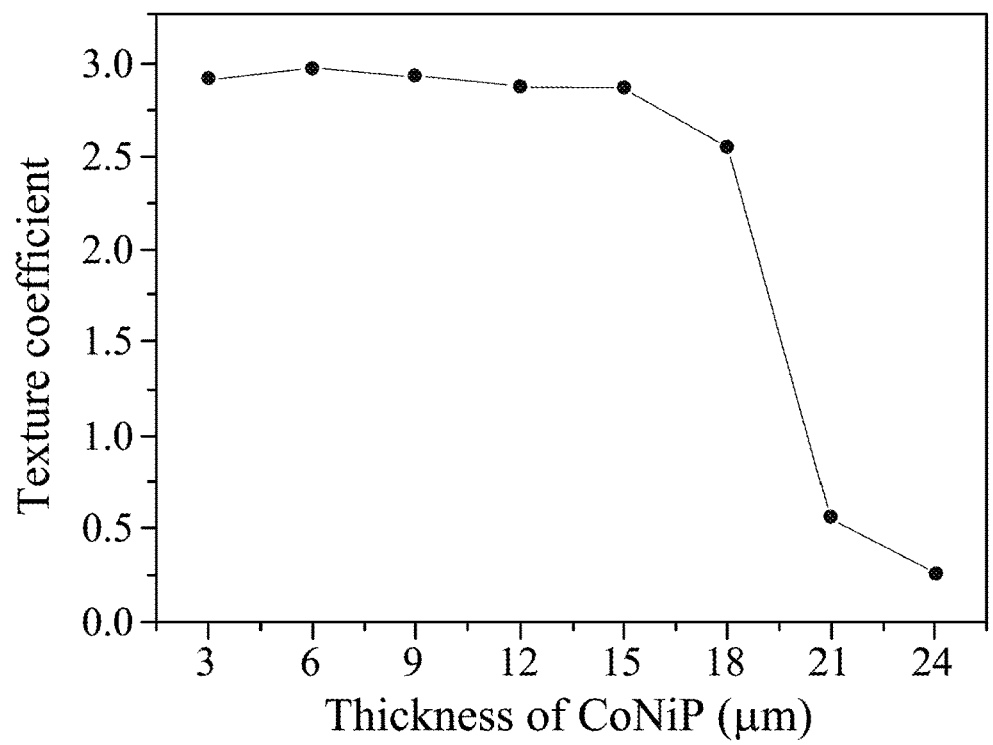
FIG. 9 shows texture coefficient varied with thickness of the texture inducing layer as in FIG. 8 along the crystalline direction HCP(002)

The samples and its analysis results of the embodiment 1 are shown in FIGS. 3~9. FIG. 3 is a B-H diagram of a 26 μm thick deposition layer (CoNiP alloy) without texture-inducing layer; FIG. 4 is a B-H diagram of a 6 μm thick deposition layer deposited (CoNiP alloy) on a 1 μm thick texture-inducing layer (CoP alloy); FIG. 5 is a B-H diagram of a 15 μm deposition layer deposited (CoNiP alloy) on a 1 μm thick texture-inducing layer (CoP alloy); FIG. 6 is a B-H diagram of a 18 μm thick deposition layer deposited (CoNiP alloy) on a 1 μm thick texture-inducing layer (CoP alloy); FIG. 7 is a B-H diagram of a 24 μm thick deposition layer deposited (CoNiP alloy) on a 1 μm thick texture-inducing layer (CoP alloy); FIG. 8 is a comparison diagram of X-ray diffraction patterns of 3~24 μm thick deposition layers (CoNiP alloy) deposited on a 1 μm thick texture-inducing layer (COP alloy) on a copper substrate; FIG. 9 shows texture coefficient varied with thickness of the texture inducing layer of FIG. 8 along the crystalline direction HCP(002).

In the embodiment 1, a 1 μm thick permanent magnetic CoP alloy having a strong texture along crystalline direction HCP (002) is electroplated on a non-magnetic copper substrate as a texture-inducing layer, the $T.C._{(002)}$ is calculated to be 2.9. Then, a thicker CoNiP alloy is deposited on the texture-inducing layer as a deposition layer. When the deposition layer (CoNiP alloy) is deposited on the copper substrate standing alone without a texture-inducing layer; it has no specified crystalline texture, and its T.C. is smaller than 0.5 The electroplating solutions are shown in TABLE 1; the electroplating temperature is 24° C., the current density is 5~20 mA/cm². From FIGS. 3~7, it is shown that there is a dramatic change on the magnetic anisotropy of the deposition layer. The magnetic anisotropy is changed from the in-plane magnetic anisotropy (represented as IP) to the perpendicular magnetic anisotropy (represented as OP, Out-of-Plane). The measurement results are shown in TABLE 2.

TABLE 2

| | only CoNiP | different thickness CoNiP deposited on 1 μm thick CoP texture-inducing layer | | |
| --- | --- | --- | --- | --- |
| CoNiP thickness (μm) | 26 | 6 | 18 | 24 |
| In-Plane $Hc_{//}$ (Oe) | 750 | 450 | 450 | 700 |
| In-Plane $Br_{//}$ (G) | 7450 | 1300 | 1350 | 3050 |
| $(BH)_{max//}$ (kGOe) | 224 | 150 | 163 | 608 |
| Out-of-Plane $Hc_{\perp}$ (Oe) | 500 | 1000 | 900 | 800 |
| Out-of-Plane $Br_{\perp}$ (G) | 950 | 1900 | 1650 | 1550 |
| $(BH)_{max\perp}$ (kGOe) | 119 | 475 | 390 | 331 |

In TABLE 2, the CoNiP alloy (deposition layer) has an in-plane magnetic anisotropy, its planar coercivity (Hc) is 500 Oe, remanence (Br) is 950 G and the maximum energy product (BH)max is 119 kGOe. In the embodiment 1, it is shown that when a 1 μm thick CoP texture-inducing layer is deposited beneath the 6 μm CoNiP deposition layer, the perpendicular magnetic properties are increased dramatically. For example, The Hc is increased to 1000 Oe, the Br is increased to 1900 G, and the (BH)max is increased to 475 kGOe. The Hc has a 100% increment, the Br has a 100% increment and the (BH)max has a 299% increment. With increasing thickness of the deposition layer CoNiP on the same 1 μm thick CoP texture-inducing layer the extent of increment in magnetic properties decreases. When comparing a 24 μm deposition layer (CoNiP alloy) with the texture-inducing layer and a 26 μm deposition layer (CoNiP alloy) without the texture-inducing layer, the Hc and the Br have increments up to 60%, and the (BH)max has an increment up to 178%. It is clearly shown that the texture-inducing layer (CoP alloy) has a dramatic influence on the magnetic properties of the deposition layer (CoNiP alloy); the magnetic anisotropy of the deposition layer has changed from the in-plane magnetic anisotropy to the perpendicular magnetic anisotropy. Therefore, the overall magnetic properties are enhanced and thereby extending the industrial applicability.

For exploring the reasons of the huge changes on the magnetic properties due to the texture-inducing structure, an XRD analysis is performed; the results are shown in FIG. 8. Since the diffraction peak of FCC-Co(111) is in part overlapping with the diffraction peak of HCP-Co(002), the intensities of the diffraction peak of HCP(002) should be first separated, by deconvolution, from that of FCC(111). Then the equation (1) is applied to calculate the texture coefficient ($T.C._{(002)}$). The relationship between the texture coefficient and the thickness of the deposition layer is shown in FIG. 9. It is shown that when the thickness of the deposition layer (CoNiP alloy) is ranged from 3~15 μm, the $T.C._{(002)}$ remains the same and is kept at about 2.7. This shows that the texture of the deposition layer is grown along with the texture of the texture-inducing layer. When the thickness of the deposition layer is greater than 18 μm, the $T.C._{(002)}$ starts to decrease. The $T.C._{(002)}$ is decreased to be smaller than 0.5 when the thickness of the deposition layer is greater than 21 μm. This shows that the crystalline texture of the deposition layer is no longer induced by the texture-inducing layer and has a free and random crystal growth when the thickness is greater than 21 μm.

Figure 10:
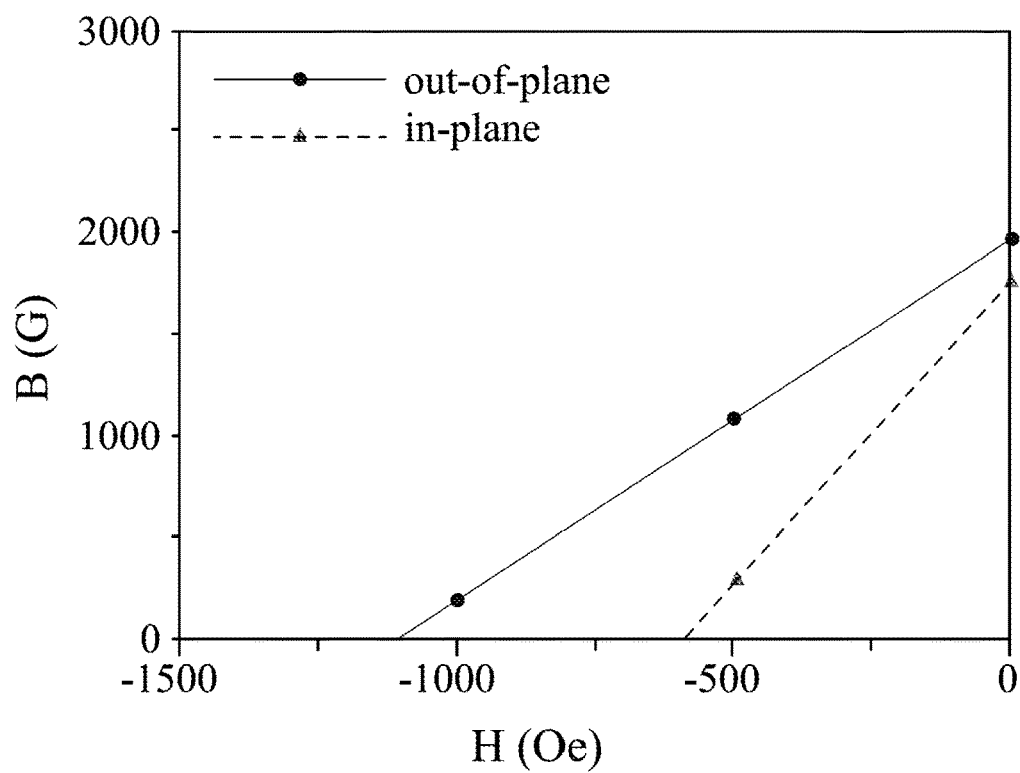
FIG. 10 is a B-H diagram of a 6 μm thickness deposition layer (CoP alloy) without a texture-inducing layer.
Figure 11:
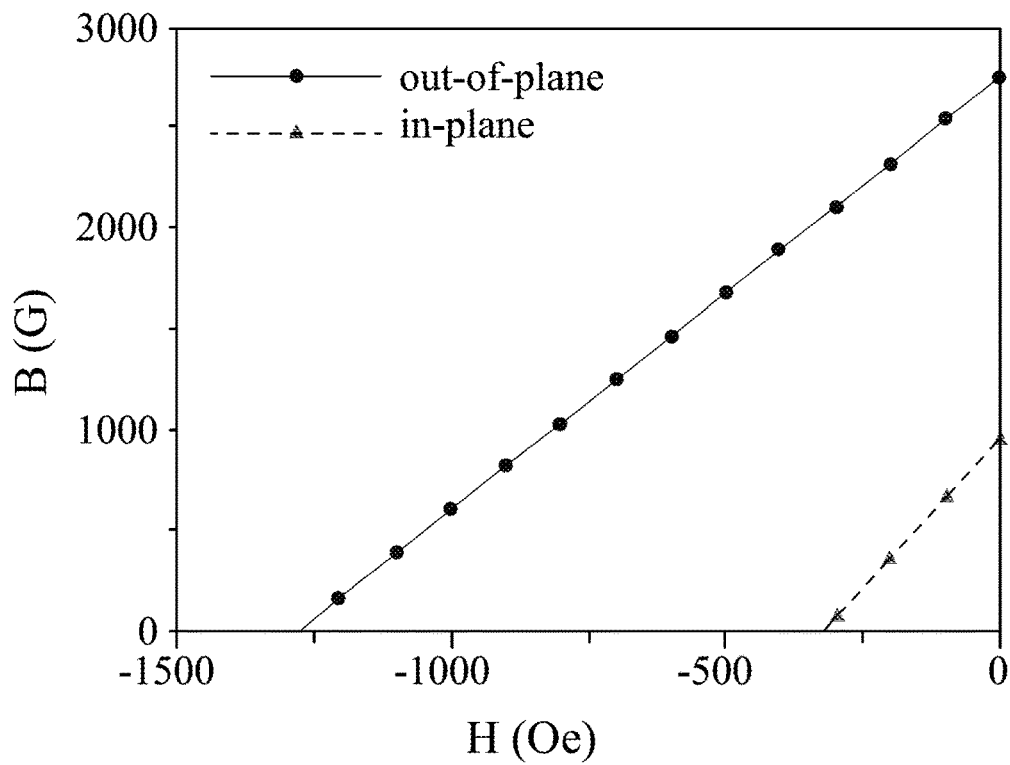
FIG. 11 is a B-H diagram of a 18 μm thickness deposition layer (CoP alloy) deposited on a 1 μm thickness texture-inducing layer (CoNiMnP alloy)
Figure 12:
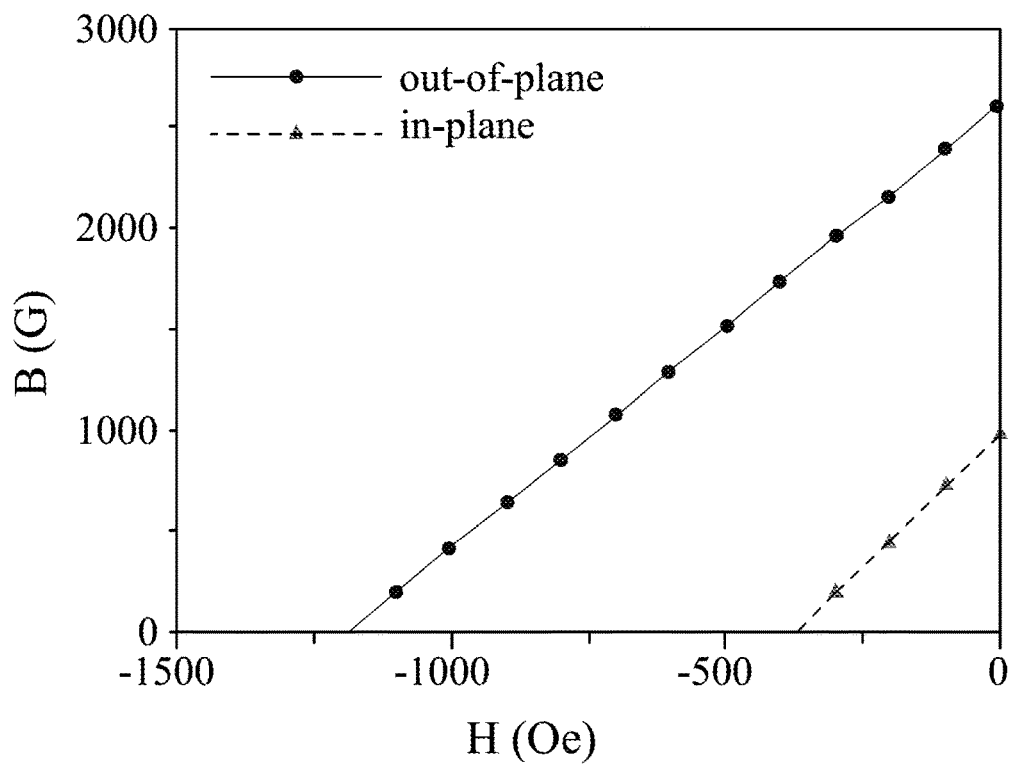
FIG. 12 is a B-H diagram of a 42 μm thickness deposition layer (CoP alloy) deposited on a 1 μm thickness texture-inducing layer (CoNiMnP alloy)
Figure 13:
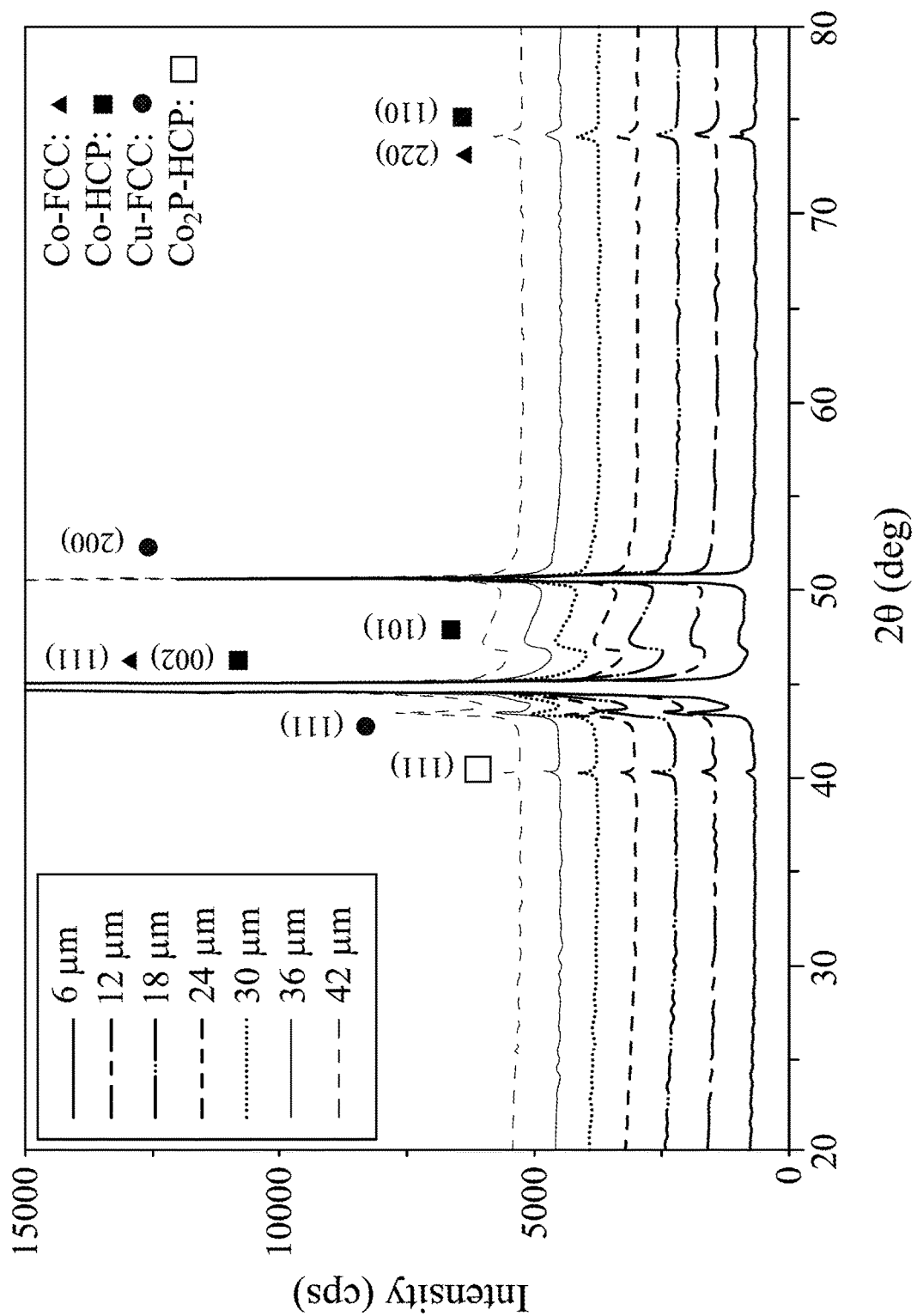
FIG. 13 is a comparison diagram of X-ray diffraction patterns of 6~42 μm thickness deposition layers (COP alloy) deposited on a 1 μm thickness texture-inducing layer (CoNiMnP alloy) on a copper substrate.
Figure 14:
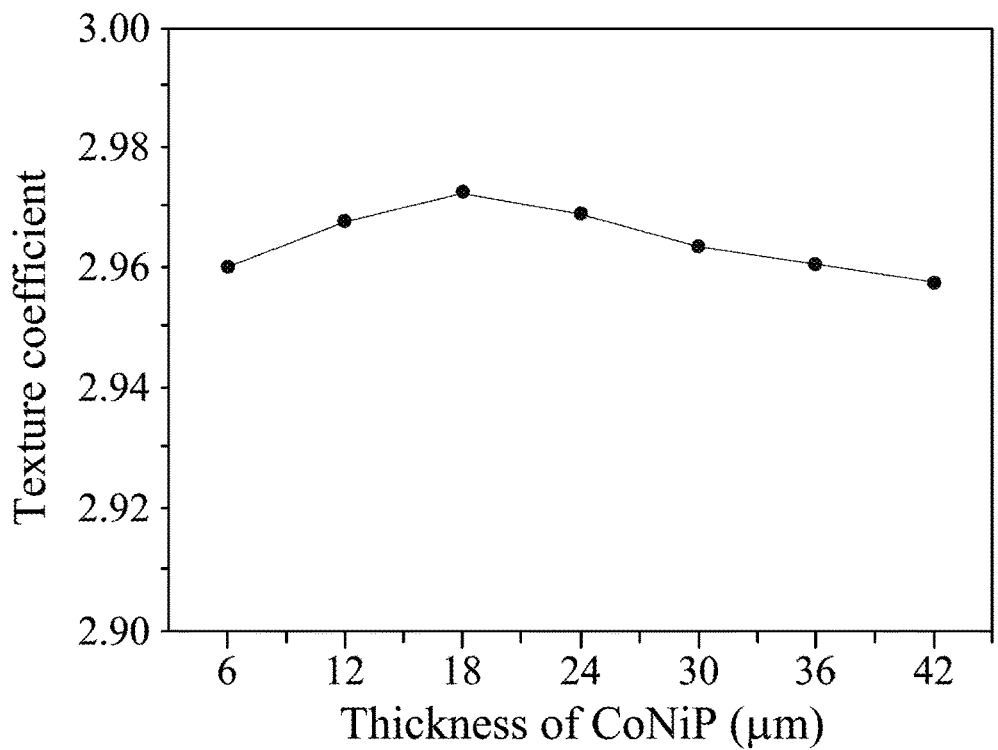
FIG. 14 shows texture coefficient varied with thickness of the texture inducing layer of FIG. 13 along the crystalline direction HCP(002)

The samples and its analysis results of the embodiment 2 are shown in FIGS. 10~14. FIG. 10 is a B-H diagram of a 6 μm thick deposition layer (CoP alloy) without a texture-inducing layer; FIG. 11 is a B-H diagram of a 18 μm thick deposition layer (COP alloy) deposited on a 1 μm thick texture-inducing layer (CoNiMnP alloy); FIG. 12 is a B-H diagram of a 42 μm thick deposition layer (CoP alloy) deposited on a 1 μm thick texture-inducing layer (CoNiMnP alloy); FIG. 13 is a comparison diagram of X-ray diffraction patterns of 6~42 μm thick deposition layers (COP alloy) deposited on a 1 μm thick texture-inducing layer (CoNiMnP alloy) on a copper substrate; FIG. 14 shows texture coefficient varied with thickness of the texture inducing layer of FIG. 13 along a crystalline direction HCP(002).

A permanent magnetic CoNiMnP alloy having a stronger intrinsic texture than that of the CoP alloy is electroplated on a non-magnetic copper substrate as a texture-inducing layer, the $T.C._{(002)}$ of CoNiMnP texture-inducing layer is 3.1. The CoNiMnP texture-inducing layer has a much better perpendicular magnetic anisotropy. Then, a thicker CoP alloy having a high HCP(002) texture is deposited on the texture-inducing layer as a deposition layer. The deposition layer has perpendicular magnetic anisotropy as well. The purpose is to observe if the perpendicular magnetic properties of the deposition layer can be further enhanced after adding the texture-inducing layer having a much better intrinsic texture. The results are shown in TABLE 3.

TABLE 3

|  | only CoP | CoP deposited on 1 μm thickness CoNiMnP texture-inducing layer | |
|---|---|---|---|
| CoP thickness (μm) | 6 | 18 | 42 |
| In-Plane $Hc_{//}$(Oe) | 600 | 350 | 400 |
| In-Plane $Br_{//}$(G) | 1750 | 950 | 1000 |
| $(BH)_{max//}$ (kGOe) | 265 | 83 | 100 |
| Out-of-Plane $Hc_{\perp}$(Oe) | 1150 | 1300 | 1200 |
| Out-of-Plane $Br_{\perp}$(G) | 2000 | 2750 | 1650 |
| $(BH)_{max\perp}$(kGOe) | 556 | 873 | 775 |

TABLE 4

|  | only CoMnP | different thckness CoMnP deposited on 4 μm CoNiMnP texture-inducing layer | |
|---|---|---|---|
| CoMnP thickness (μm) | 6.5 | 6 | 9 |
| In-Plane $Hc_{//}$(Oe) | 550 | 700 | 500 |
| In-Plane $Br_{//}$(G) | 1500 | 4650 | 1850 |
| $(BH)_{max//}$(kGOe) | 189 | 759 | 233 |
| Out-of-Plane $Hc_{\perp}$(Oe) | 1200 | 1150 | 1300 |
| Out-of-Plane $Br_{\perp}$(G) | 2200 | 3150 | 3000 |
| $(BH)_{max\perp}$(kGOe) | 660 | 906 | 969 |

From TABLE 3, the Hc is 1150 Oe, the Br is 2000 G and the $(BH)_{max}$ is 556 kGOe for the deposition layer (CoP alloy) without the texture-inducing layer. When the thinner texture-inducing layer (CoNiMnP alloy) is added, in the situation that the thickness of the deposition layer (CoP alloy) is 18 μm thick, the perpendicular magnetic properties also show increments, though not large in extent. The Hc is increased to 1300 Oe, the Br is increased to 2750 G and the $(BH)_{max}$ is increased to 873 kGOe. The Hc has a 13% increment, the Br has a 38% increment and the $(BH)_{max}$ has a 57% increment. In the embodiment 2, it is shown that a texture-inducing layer having a better texture along the crystalline direction HCP(002) can enhance the texture of the deposition layer having the same crystalline direction and a weaker T.C. The aforementioned embodiments show that the texture-inducing layer has a great influence on enhancing the magnetic properties. Similarly, the XRD analysis is also performed to analyze the deposition layer (CoP alloy) having different thickness and is shown in FIG. 13. The trends of the changes of the texture coefficients are shown in FIG. 14. Form FIG. 14, it is shown that the T.C. of the deposition layer (CoP alloy) is increased owing to the influence of the texture-inducing layer (CoNiMnP) before 18 μm thickness. When the thickness of the deposition layer is greater than 18 μm, the T.C. remains a high value.

Figure 15:
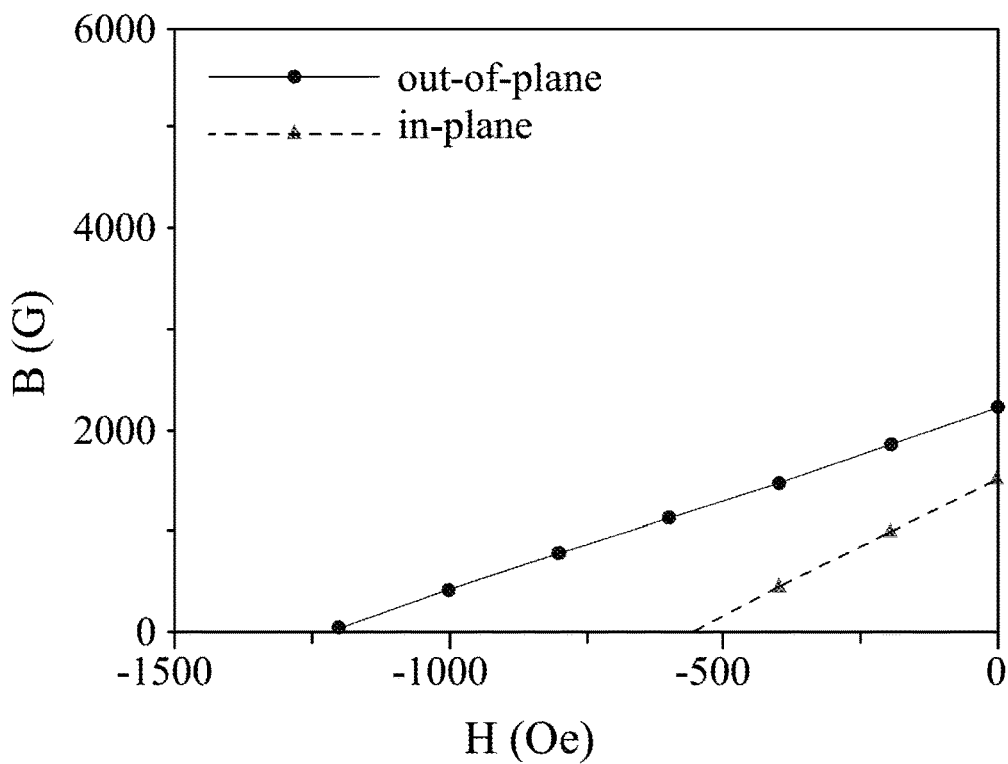
FIG. 15 is a B-H diagram of a 6.5 μm thickness deposition layer (CoMnP alloy) without a texture-inducing layer.
Figure 16:
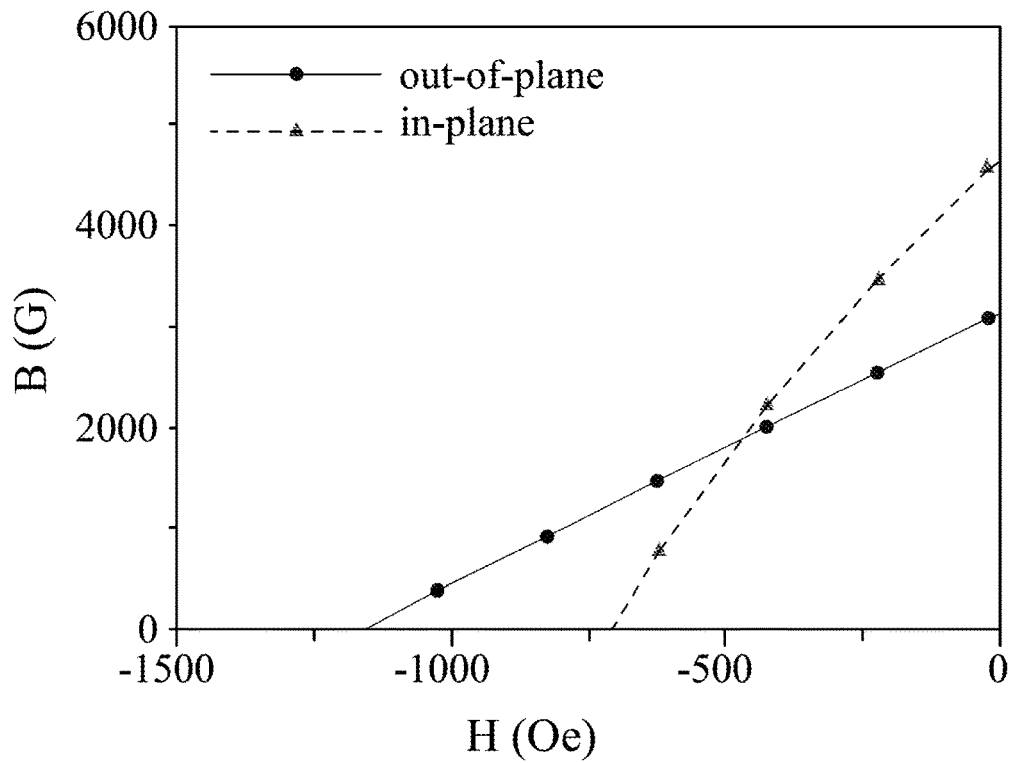
FIG. 16 is a B-H diagram of a 6 μm thickness deposition layer (CoMnP alloy) deposited on a 4 μm thickness texture-inducing layer (CoNiMnP alloy)
Figure 17:
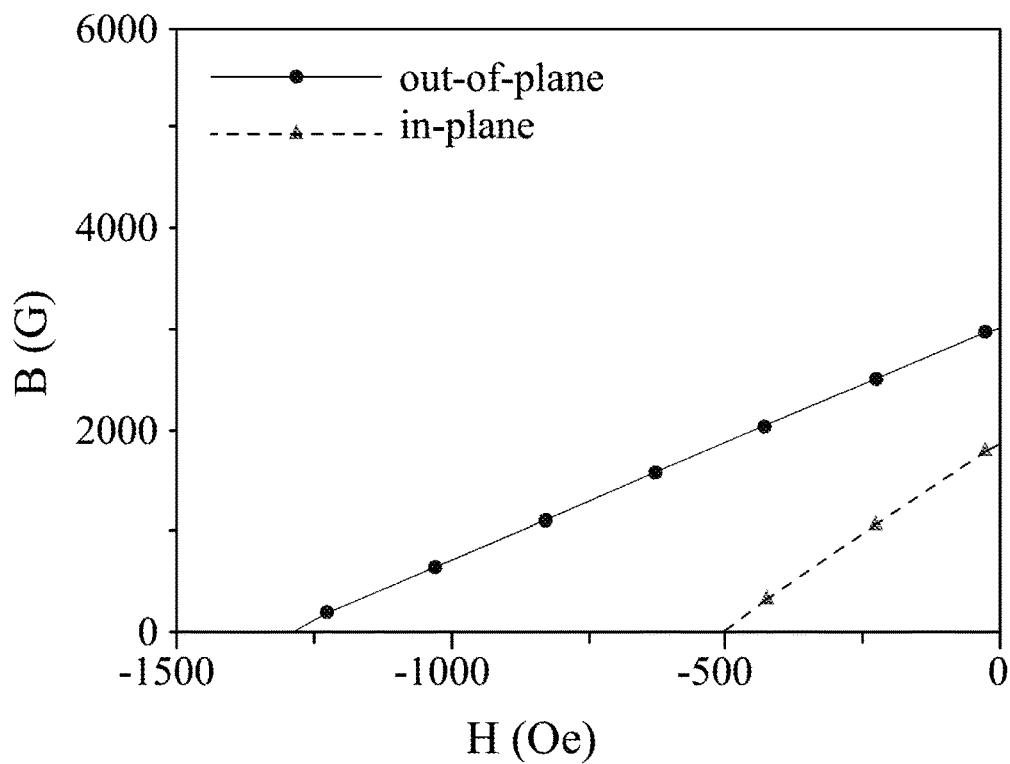
FIG. 17 is a B-H diagram of a 9 μm thickness deposition layer (CoMnP alloy) deposited on a 4 μm thickness texture-inducing layer (CoNiMnP alloy)
Figure 18:
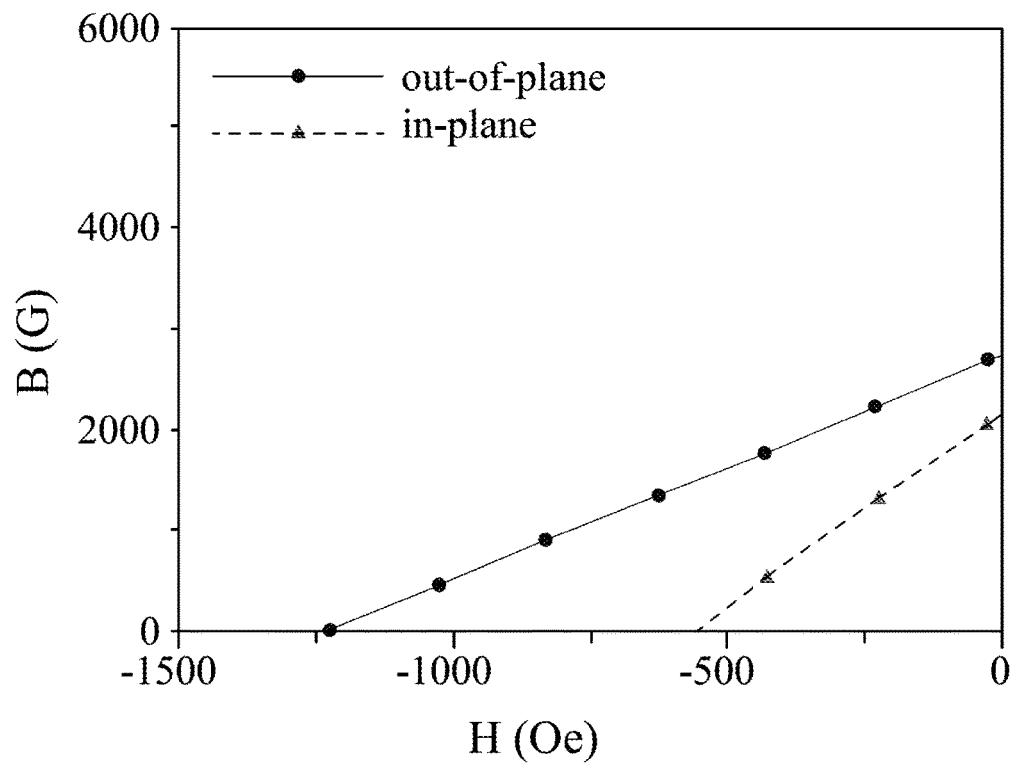
FIG. 18 is a B-H diagram of a 12 μm thickness deposition layer (CoMnP alloy) deposited on a 4 μm thickness texture-inducing layer (CoNiMnP alloy)
Figure 19:
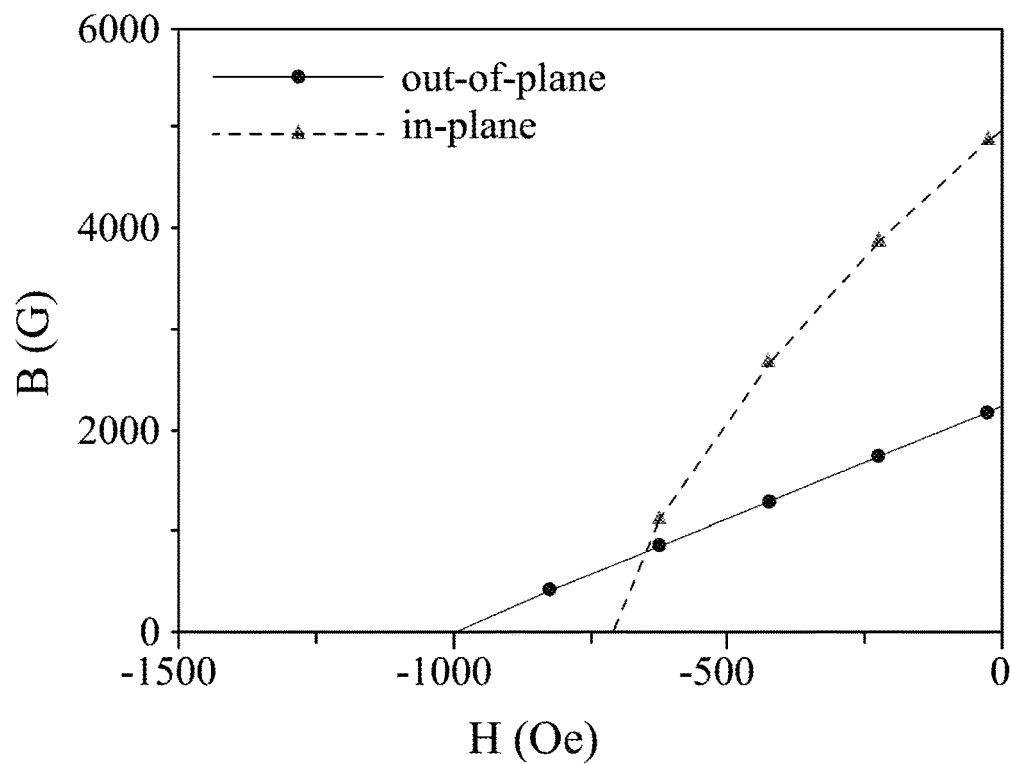
FIG. 19 is a B-H diagram of a 15 µm thickness deposition layer (CoMnP alloy) deposited on a 4 µm thickness texture-inducing layer (CoNiMnP alloy)
Figure 20:
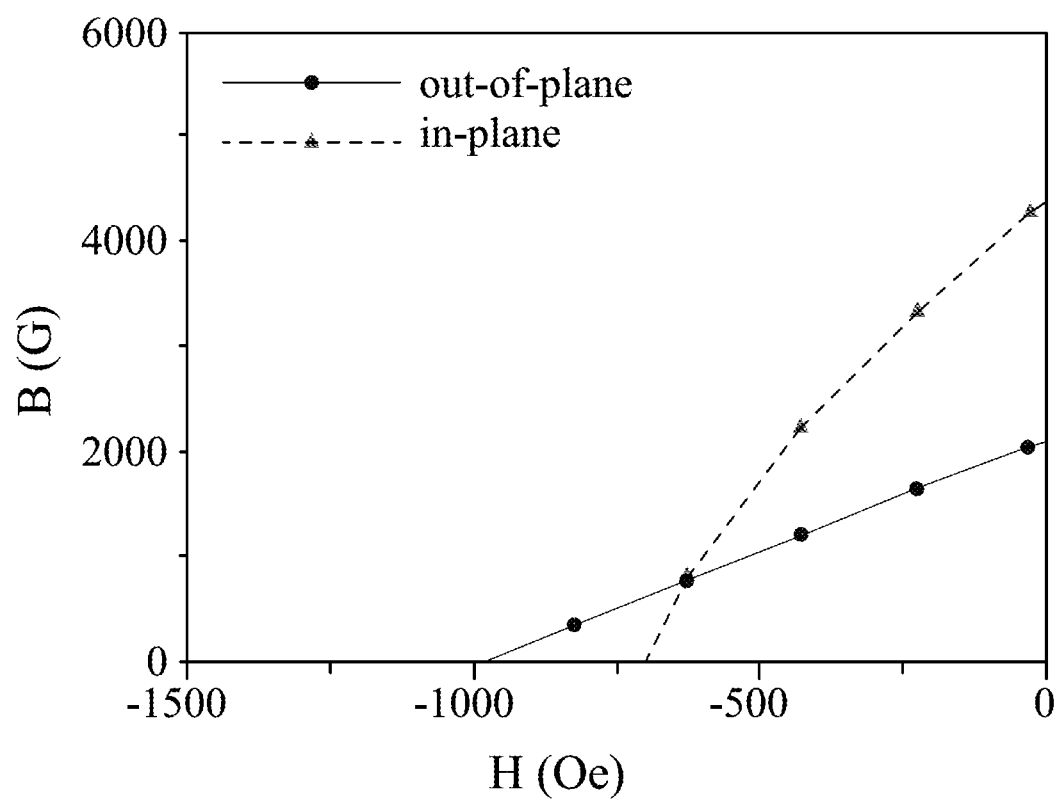
FIG. 20 is a B-H diagram of a 18 µm thickness deposition layer (CoMnP alloy) deposited on a 4 µm thickness texture-inducing layer (CoNiMnP alloy)

The samples and its analysis results of the embodiment 3 are shown in FIGS. 15~20. FIG. 15 is a B-H diagram of a 6.5 μm thick deposition layer (CoMnP alloy) without texture-inducing layer; FIG. 16 is a B-H diagram of a 6 μm thick deposition layer (CoMnP alloy) deposited on a 4 μm thick texture-inducing layer (CoNiMnP alloy); FIG. 17 is a B-H diagram of a 9 μm thick deposition layer (CoMnP alloy) deposited on a 4 μm thick texture-inducing layer (CoNiMnP alloy); FIG. 18 is a B-H diagram of a 12 μm thick deposition layer (CoMnP alloy) deposited on a 4 μm thick texture-inducing layer (CoNiMnP alloy); FIG. 19 is a B-H diagram of a 15 μm thick deposition layer (CoMnP alloy) deposited on a 4 μm thick texture-inducing layer (CoNiMnP alloy); FIG. 20 is a B-H diagram of a 18 μm thick deposition layer (CoMnP alloy) deposited on a 4 μm thick texture-inducing layer (CoNiMnP alloy).

In the embodiment 3, a permanent magnetic CoMnP alloy having a perpendicular magnetic anisotropy is discussed. Similarly, the magnetic strength of the deposition layer (CoMnP alloy) can be enhanced by electroplating a thin CoNiMnP alloy on a non-magnetic copper substrate as a texture-inducing layer. It can be observed that the best performance of the deposition layer (CoMnP alloy) is occurred by the inducing of the texture-inducing layer (CoNiMnP alloy) having different thicknesses ranged from 1~5 μm thickness. The texture-inducing layer also has different influences on the deposition layer having different thicknesses. The results are shown in TABLE 4.

From TABLE 4, the in-plane Hc is 1200 Oe, the Br is 2200 G and the $(BH)_{max}$ is 660 kGOe. After adding the texture-inducing layer with proper thickness, the perpendicular magnetic properties reach the maximum performance when the thickness of the deposition layer is 9 μm; the Hc of the composite structure is 1300 Oe, the Br is 3000 G and the $(BH)_{max}$ is 969 kGOe. The Hc has a 8% increment, the Br has a 36% increment and the $(BH)_{max}$ has a 47% increment. When the thickness of the deposition layer reaches 15 μm, the perpendicular magnetic values starts to decrease. The result shows that the texture-inducing layer (CoNiMnP alloy) can effectively influence the perpendicular magnetic values of the deposition layer (CoMnP alloy), which itself is already HCP(002) textured.

In the horizontal direction (In-Plane), the Hc of the deposition layer (CoMnP alloy) without the texture-inducing layer (CoNiMnP alloy) is 550 Oe, the Br is 1500 G and the $(BH)_{max}$ is 189 kGOe. After adding the texture-inducing layer with proper thickness, the in-plane $(BH)_{max}$ is enhanced. When the thickness of the composite layer reaches to 15 μm, the Hc is 700 Oe, the Br is 5000 G and the $(BH)_{max}$ is 1127 kGOe. Therefore, the Hc has a 27% increment, the Br has a 233% increment and the $(BH)_{max}$ has a 496% increment, and the best horizontal magnetic properties can be obtained. Furthermore, when the thickness of the deposition layer (CoMnP alloy) reaches 6 μm, its horizontal magnetic properties start to be influenced by the texture-inducing layer (CoNiMnP alloy).

In summary, the texture-inducing layer of the present disclosure is selected as a thinner alloy having an intrinsically strong texture, and the texture coefficient thereof is greater than 2.5; then, a thicker alloy is selected as the deposition layer, and the texture of the deposition layer can grow along with the texture of the texture-inducing layer thereby enhancing the properties of the deposition layer. The texture-inducing layer and the deposition layer can be made from the same or different alloys. In one embodiment, the texture-inducing layer is a 1 μm CoP alloy (including 6~8 wt % P), and the deposition layer is 8~24 μm CoNiP alloys, the composite structure has a perpendicular magnetic anisotropy, the Hc is 500 Oe, the Br is 1550 G and the $(BH)_{max}$ is 331 kGOe. Compared to the deposition layer without the texture-inducing layer, it has an in-plane magnetic anisotropy, the increments of the Hc and the Br can be enhanced up to 60~100%, and the increments of the $(BH)_{max}$ can be enhanced up to 178~200%. This results show the signification influence of the texture-inducing layer.

Figure 21:
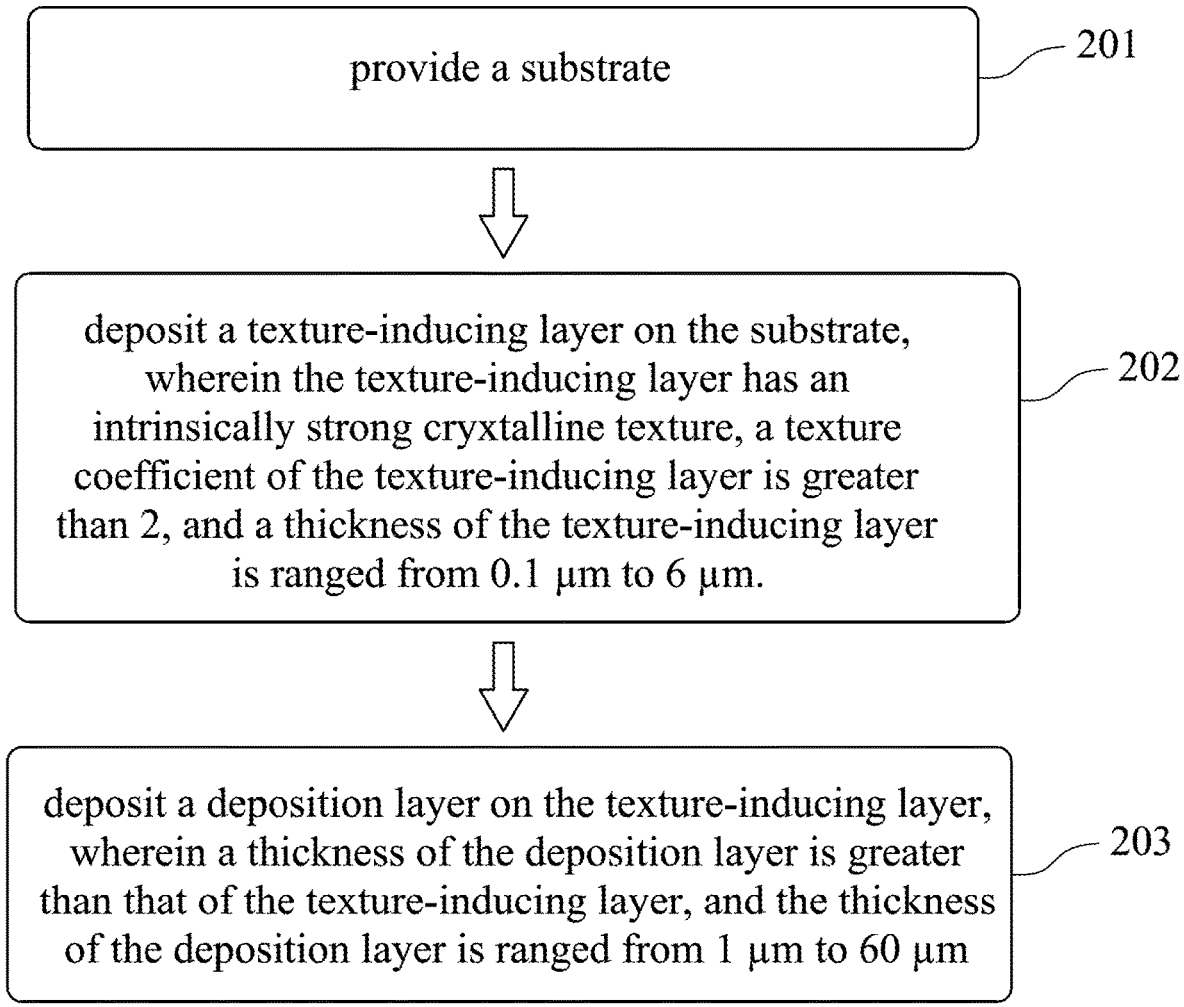
FIG. 21 is a flow chart of a texture inducing method according to one embodiment of the present disclosure.
Figure 22:
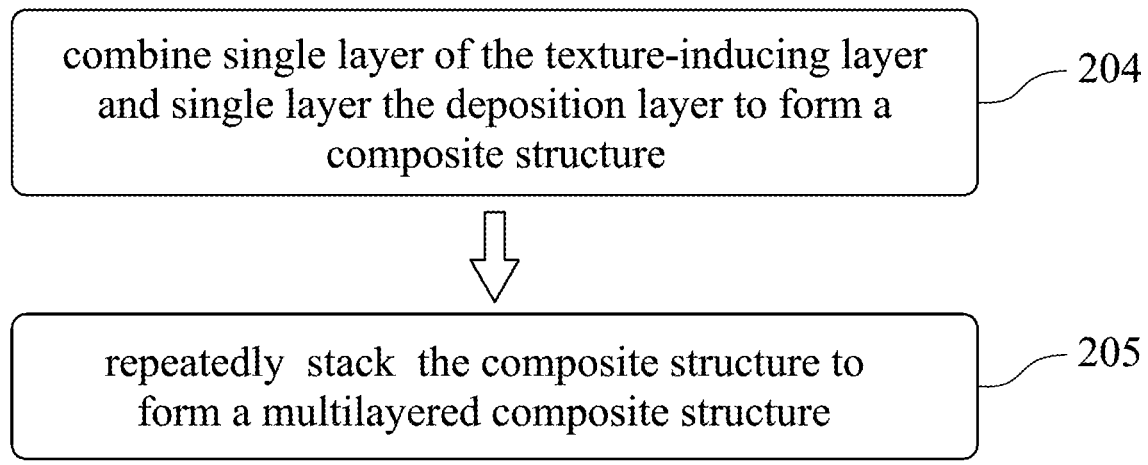
FIG. 22 is a flow chart of a texture inducing method according to another embodiment of the present disclosure.

FIG. 21 is a flow chart of a texture inducing method according to one embodiment of the present disclosure; FIG. 22 is a flow chart of a texture inducing method according to another embodiment of the present disclosure.

The present disclosure also provides a texture inducing method that is applicable to the aforementioned texture inducing structure 100. The texture inducing method includes: a step 201 for providing a substrate; a step 202 for depositing a texture-inducing layer on the substrate, wherein the texture-inducing layer has an intrinsically strong crystalline texture, a texture coefficient of the texture-inducing layer is greater than 2, and a thickness of the texture-inducing layer is ranged from 0.1 μm to 6 μm; a step 203 for depositing a deposition layer on the texture-inducing layer, wherein a thickness of the deposition layer is greater than that of the texture-inducing layer, and the thickness of the deposition layer is ranged from 1 μm to 60 μm.

The texture inducing method further includes: a step 204 for combining a single layer of the texture-inducing layer and a single layer of the deposition layer to form a composite structure; and a step 205 for repeatedly stacking the composite structure to form a multilayered composite structure. Therefore, the composite structure can be stacked to a multilayered composite structure as shown in FIG. 2 in accordance with different requirements on the thickness.

From the above embodiments; it has been proved that the texture-inducing layer having intrinsically strong crystalline texture can induce the texture of the deposition layer thereby dramatically enhancing the magnetic properties. Furthermore, although the embodiments are demonstrated using the magnetic alloys, other alloy systems such as strength, hardness, thermal conductivity and electrical conductivity alloys may also be applied. The texture-inducing layers having different material properties can be used to change the material properties of different deposition layers. From the view of the industrialization, the present disclosure provides a simple structured composite structure that is capable of changing the magnetic properties of existing alloys. Furthermore, the composite structure can be repeatedly stacked in accordance with different requirements on the thickness. Accordingly, the manufacturing method and the structure of the present disclosure are simple and have high industrial applicability.

The present disclosure can also be applied in different micro structures and devices requiring the large magnetic energy product, such as sensors, micro-actuators, MEMS systems, magnetic encoders or other composite structure that requires high coercivity.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A texture inducing structure for alloy films, the texture inducing structure comprising:
   a substrate;
   a texture-inducing layer formed on the substrate, wherein the texture-inducing layer has an intrinsically crystalline texture, a texture coefficient of the texture-inducing layer is greater than 2, and a thickness of the texture-inducing layer is ranged from 0.1 μm to 6 μm; and
   a deposition layer formed on the texture-inducing layer, wherein the texture of the deposition layer is induced by the texture-inducing layer thereby changing the magnetic anisotropy and the magnetic strength of the deposition layer, a thickness of the deposition layer is ranged from 1~60 μm, and the thickness of the deposition layer is greater than that of the texture-inducing layer;
   wherein the texture coefficient of the texture-inducing layer can be calculated by the following equation:

$$T.C._{(002)} = \frac{I_{(002)}/I_{0(002)}}{\frac{1}{n}\sum [I_{(hkl)}/I_{0(hkl)}]};$$

where $I_{(002)}$ and $I_{(hkl)}$ are the intensities of the peaks of X-ray diffraction patterns of $HCP_{(002)}$ and $HCP_{(hkl)}$ taken on the texture-inducing layer, respectively; $I_{0(002)}$ and $I_{0(hkl)}$ are the intensities of the peaks of standard X-ray diffraction patterns from JCPDS card of $HCP_{(002)}$ and $HCP_{(hkl)}$ of the texture-inducing layer, respectively.

2. The texture inducing structure of claim 1, wherein a single layer of the texture-inducing layer and a single layer of the deposition layer are stacked to form a composite structure, and the composite structure is repeatedly stacked to form a multilayered composite structure.

3. The texture inducing structure of claim 1, wherein the texture coefficient of the texture-inducing layer is greater than 2.5, and the thickness of the texture-inducing layer is ranged from 0.1 μm~6 μm.

4. The texture inducing structure of claim 1, wherein the texture-inducing layer is a CoP alloy or a CoNiMnP alloy.

5. The texture inducing structure of claim 1, wherein the texture-inducing layer and the deposition layer are made from permanent magnet alloys.

6. A texture inducing method for alloy films, the texture inducing method comprising:
   providing a substrate;
   depositing a texture-inducing layer on the substrate, wherein the texture-inducing layer has an intrinsically crystalline texture, a texture coefficient of the texture-inducing layer is greater than 2, and a thickness of the texture-inducing layer is ranged from 0.1 μm to 6 μm; and
   depositing a deposition layer on the texture-inducing layer, wherein the thickness of the deposition layer is greater than that of the texture-inducing layer, and the thickness of the deposition layer is ranged from 1 μm to 60 μm;
   wherein the texture coefficient of the texture-inducing layer can be calculated by the following equation:

$$T.C._{(002)} = \frac{I_{(002)}/I_{0(002)}}{\frac{1}{n}\sum [I_{(hkl)}/I_{0(hkl)}]};$$

where $I_{(002)}$ and $I_{(hkl)}$ are the intensities of the peaks of X-ray diffraction patterns of $HCP_{(002)}$ and $HCP_{(hkl)}$ taken on the texture-inducing layer, respectively; $I_{0(002)}$ and $I_{0(hkl)}$ are the intensities of the peaks of standard X-ray diffraction patterns from JCPDS card of $HCP_{(002)}$ and $HCP_{(hkl)}$ of the texture-inducing layer, respectively.

7. The texture inducing method of claim 6, wherein the texture coefficient of the texture-inducing layer is greater than 2.5, and the thickness of the texture-inducing layer is ranged from 0.1 μm to 6 μm.

8. The texture inducing method of claim 6, wherein the texture-inducing layer is a CoP alloy or a CoNiMnP alloy.

9. The texture inducing method of claim 6, wherein the texture-inducing layer and the deposition layer are made from permanent magnet alloys.

10. The texture inducing method of claim 6, further comprising:
- combining single layer of the texture-inducing layer and single layer of the deposition layer to form a composite structure; and
- repeatedly stacking the composite structure to form a multilayered composite structure.

\* \* \* \* \*